(12) United States Patent
Xin et al.

(10) Patent No.: US 11,018,197 B2
(45) Date of Patent: May 25, 2021

(54) DISPLAY PANEL AND FABRICATION METHOD THEREOF

(71) Applicant: Shanghai Tianma AM-OLED Co., Ltd., Shanghai (CN)

(72) Inventors: Yu Xin, Shanghai (CN); Lijing Han, Shanghai (CN); Xian Chen, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/156,489

(22) Filed: Oct. 10, 2018

(65) Prior Publication Data

US 2019/0206951 A1 Jul. 4, 2019

(30) Foreign Application Priority Data

Jan. 4, 2018 (CN) .......................... 201810008064.4

(51) Int. Cl.
*H01L 27/32* (2006.01)
*H01L 51/56* (2006.01)
*H01L 51/00* (2006.01)

(52) U.S. Cl.
CPC ........ *H01L 27/3218* (2013.01); *H01L 51/001* (2013.01); *H01L 51/0011* (2013.01); *H01L 51/56* (2013.01); *H01L 27/3216* (2013.01)

(58) Field of Classification Search
CPC . H01L 27/3218; H01L 51/56; H01L 51/0011; H01L 51/0001; H01L 27/3216; H01L 27/3244; H01L 27/3246; H01L 27/326
See application file for complete search history.

(56) References Cited

U.S. PATENT DOCUMENTS

| 10,224,378 | B2 * | 3/2019 | Zhang | ................ H01L 27/3218 |
| 2014/0198479 | A1 * | 7/2014 | Chao | ................... H01L 27/3218 362/84 |
| 2017/0287988 | A1 * | 10/2017 | Lee | ........................ H01L 27/326 |
| 2018/0166510 | A1 * | 6/2018 | Lee | ..................... H01L 27/3211 |

FOREIGN PATENT DOCUMENTS

| CN | 104282710 A | 1/2015 |
| CN | 104282727 A | 1/2015 |
| CN | 104617126 A | 5/2015 |
| CN | 104299974 B | 2/2017 |

* cited by examiner

*Primary Examiner* — Bilkis Jahan
*Assistant Examiner* — Victor V Barzykin
(74) *Attorney, Agent, or Firm* — Anova Law Group PLLC

(57) ABSTRACT

A display panel and a fabrication method of the display panel are provided. The display panel includes a plurality of pixel rows, which includes first pixel rows and second pixel rows that are alternately arranged and is extended along a first direction. A first pixel row includes a plurality of first units, and a first unit includes two first sub-pixels arranged along a second direction with a same color. First sub-pixels in adjacent first units have different colors. The second direction intersects with and is non-perpendicular to the first direction. A second pixel row includes a plurality of second units, and a second unit includes two second sub-pixels arranged along the second direction with a same color. The first pixel rows and the second pixel rows are alternately arranged in a third direction perpendicular to the first direction. The first sub-pixels have a color different from the second sub-pixels.

13 Claims, 9 Drawing Sheets

DISPLAY PANEL AND FABRICATION METHOD THEREOF

CROSS-REFERENCES TO RELATED APPLICATIONS

This application claims the priority of Chinese patent application No. 201810008064.4, filed on Jan. 4, 2018, the entirety of which is incorporated herein by reference.

FIELD OF THE DISCLOSURE

The present disclosure generally relates to the field of display technology and, more particularly, relates to a display panel and fabrication method thereof.

BACKGROUND

With the continuous development of display technology, requirements for the resolution of display panels become higher and higher. To achieve high resolution of the display panel, higher requirements are needed on the mask.

However, under existing process conditions, a critical dimension of the mask and a width of a mask opening are often greater than 20 μm. If the critical dimension of the mask is less than 20 μm, accuracy of the fabricated mask cannot be guaranteed. If the critical dimension of the mask is too large, the resolution of the display panel is directly affected.

Moreover, in an existing pixel arrangement structural design, the spacing between adjacent sub-pixels with different colors cannot be too small, otherwise a color mixing issue is likely to occur. The spacing between adjacent sub-pixels with different colors is one of reasons that affect the aperture ratio of the display panel, which limits further improvement of the aperture ratio of the display panel, and limits further improvement of the display performance of the display panel.

Therefore, it is urgently desired for a display panel and fabrication method thereof to resolve the above issues. The disclosed display panel and fabrication method are directed to solve one or more problems set forth above and other problems in the art.

BRIEF SUMMARY OF THE DISCLOSURE

One aspect of the present disclosure provides a display panel. The display panel includes a plurality of pixel rows extended along a first direction. The plurality of pixel rows includes first pixel rows and second pixel rows that are alternately arranged. A first pixel row includes a plurality of first units, and a first unit of the plurality of first units includes two first sub-pixels with a same color. The two first sub-pixels in the first unit are arranged along a second direction. First sub-pixels in adjacent first units have different colors. The second direction intersects with and is non-perpendicular to the first direction. A second pixel row includes a plurality of second units, and a second unit of the plurality of second units includes two second sub-pixels with a same color. The two second sub-pixels in the second unit are arranged along the second direction. The first pixel rows and the second pixel rows are alternately arranged in a third direction perpendicular to the first direction. The first sub-pixels have a color different from the second sub-pixels.

Another aspect of the present disclosure provides a fabrication method of a display panel. The method includes providing a substrate including a plurality of pixel rows extended along a first direction. The plurality of pixel rows includes first pixel rows and second pixel rows that are alternately arranged. A first pixel row includes a plurality of first units, and a first unit of the plurality of first units includes two first sub-pixels with a same color. The two first sub-pixels in the first unit are arranged along a second direction. First sub-pixels in adjacent first units have different colors. The second direction intersects with and is non-perpendicular to the first direction. A second pixel row includes a plurality of second units, and a second unit of the plurality of second units includes two second sub-pixels with a same color. The two second sub-pixels in the second unit are arranged along the second direction. The first pixel rows and the second pixel rows are alternately arranged in a third direction perpendicular to the first direction. The first sub-pixels have a color different from the second sub-pixels.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Figure 1:
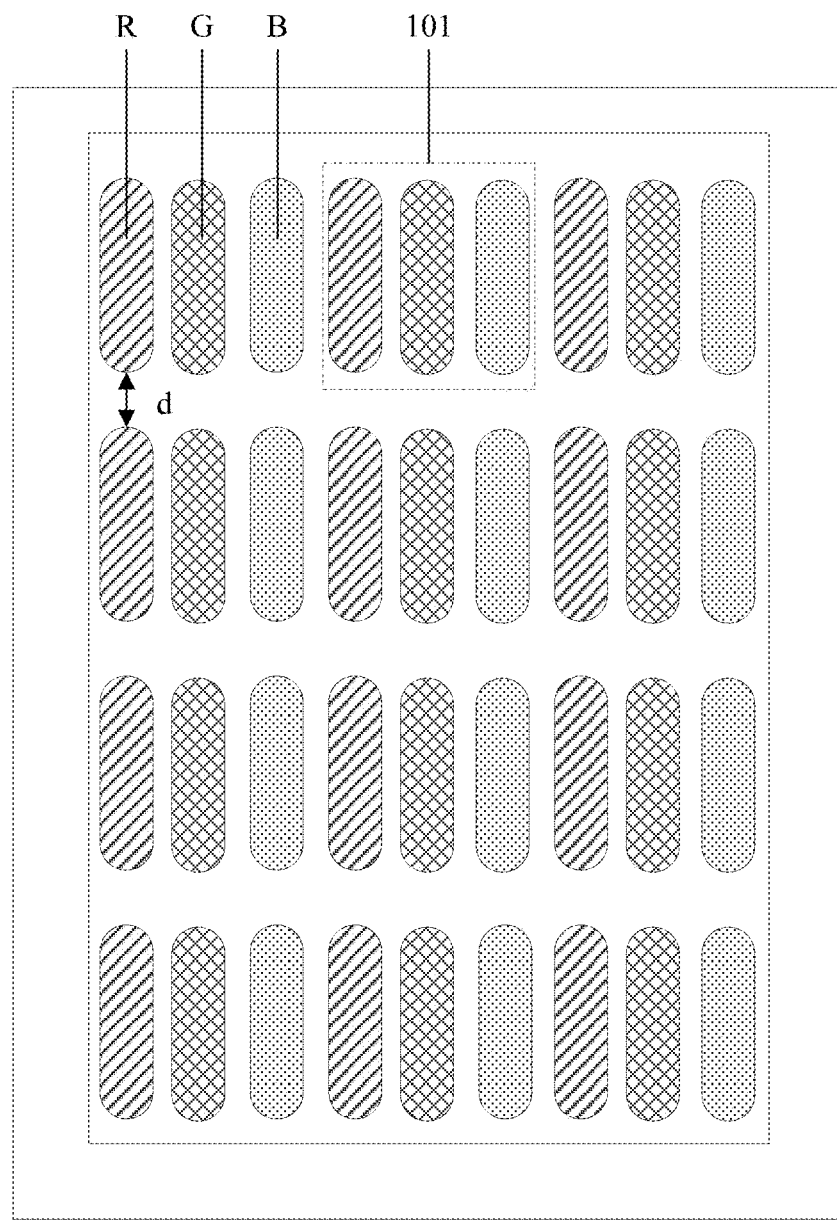
FIG. 1 illustrates a schematic diagram of a pixel arrangement structure of an existing display panel.

FIG. 1 illustrates is a schematic diagram of a pixel arrangement structure of an existing display panel. Referring to FIG. 1, the display panel includes a plurality of pixel units 101 arranged in a manner as "real color". A pixel unit 101 includes three sub-pixels, including a red sub-pixel R, a green sub-pixel G, and a blue sub-pixel B that are successively arranged, respectively. A pixel row includes a plurality of pixel units 101, and sub-pixels with a same color are arranged in a direction perpendicular to a direction of the pixel row. For the pixel arrangement structure illustrated in FIG. 1, due to limitations of the mask fabrication process, the mask bridge has a certain width (equal to a spacing 'd' between adjacent two sub-pixels with a same color), which further limits the increase of the aperture ratio of the display panel. Moreover, a spacing between adjacent two sub-pixels in a same one pixel row cannot be too small, otherwise, the color mixing issue is likely to occur, which also limits the increase of the aperture ratio of the display panel.

Figure 2:
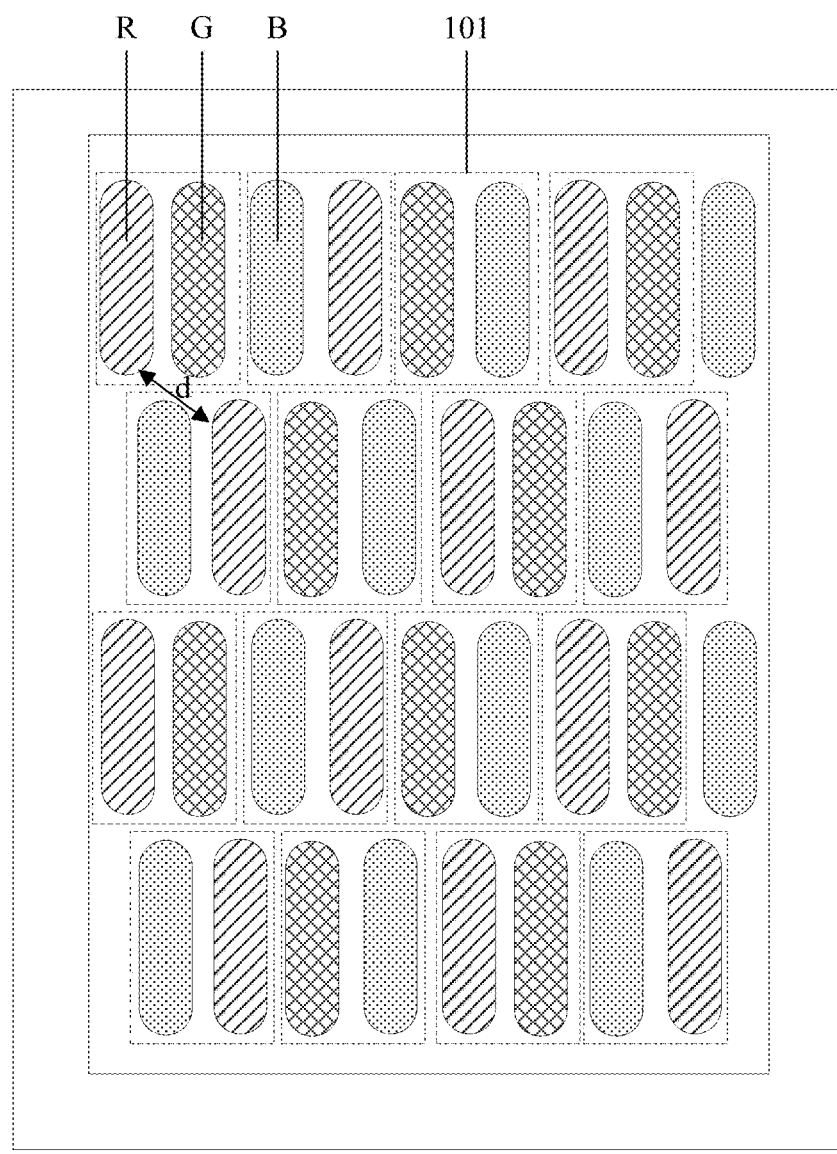
FIG. 2 illustrates a schematic diagram of a pixel arrangement structure of another existing display panel.

FIG. 2 illustrates a schematic diagram of a pixel arrangement structure of another existing display panel. Referring to FIG. 2, the display panel includes a plurality of pixel units 101. A pixel unit 101 includes two sub-pixels with different colors, and the sub-pixels include a red sub-pixel R, a green sub-pixel G, and a blue sub-pixel B. A pixel row includes a plurality of pixel units 101. In any one pixel row, any one sub-pixel and its adjacent two sub-pixels have different colors. In other words, any three consecutive sub-pixels are different in color. Two sub-pixels in any one pixel unit 101 and one sub-pixel in an adjacent pixel row are arranged in an isosceles triangle, and the three sub-pixels have different colors.

Under the same limitations of the mask fabrication process, compared to the pixel arrangement structure illustrated in FIG. 1, the pixel arrangement structure illustrated in FIG. 2 can increase the aperture ratio of the display panel. However, due to the limitations of the mask fabrication process, an area of the mask opening is still limited, thereby limiting the further increase of the aperture ratio of the display panel. Moreover, the sub-pixels with different colors in a same one pixel row are likely to have the color mixing issue during an evaporation process. Therefore, a spacing between adjacent two sub-pixels with different colors cannot be too small, which limits the further increase of the aperture ratio of the display panel.

For the display panel in FIG. 2, because a sharing sub-pixels issue is involved in an image display process, when displaying certain images, the jagged twill is likely to occur, especially at the boundary of the image, which affects the display performance of the display panel.

Therefore, to solve the above issues, the present disclosure provides a display panel and fabrication method thereof. The display panel and fabrication method are described in detail below with reference to the accompanying drawings.

Figure 3:
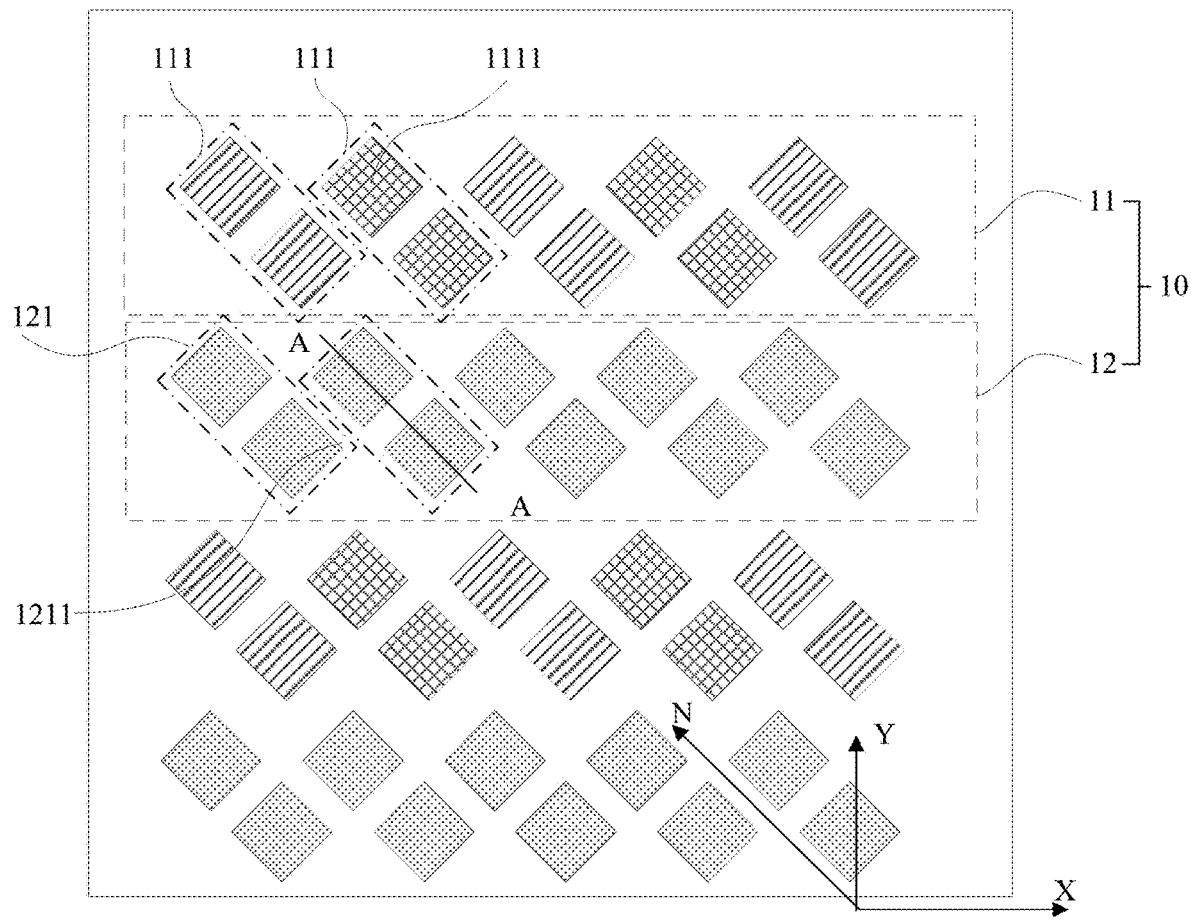
FIG. 3 illustrates a schematic top view of an exemplary display panel consistent with disclosed embodiments of the present disclosure.

FIG. 3 illustrates a schematic top view of an exemplary display panel consistent with disclosed embodiments of the present disclosure. Referring to FIG. 3, a display panel may include a plurality of pixel rows 10 extended along a first direction X. The plurality of pixel rows 10 may include alternately-arranged first pixel rows 11 and second pixel rows 12. A first pixel row 11 may include a plurality of first units 111, and a first unit 111 may include two first sub-pixels 1111 with a same color. The first sub-pixels 1111 in the first unit 111 may be arranged along a second direction N. The first sub-pixels 1111 in adjacent first units 111 may have different colors. The second direction N may intersect with but may not be perpendicular to the first direction X. A second pixel row 12 may include a plurality of second units 121, and a second unit 121 may include two second sub-pixels 1211 with a same color. The second sub-pixels 1211 in the second unit 121 may be arranged along the second direction N. The first pixel rows 11 and the second pixel rows 12 may be alternately arranged along a third direction Y perpendicular to the first direction X. The first sub-pixel 1111 may have a color different from the second sub-pixel 1211.

In the display panel in the present disclosure, two sub-pixels with a same color (the sub-pixel may refer to the first sub-pixel or the second sub-pixel) may form one unit, and the two sub-pixels in the one unit may be fabricated by evaporation at the same time. In other words, the two sub-pixels in the one unit may share one mask opening. In a case where the area of sub-pixels is constant, the size of the mask opening may increase, thereby reducing the fabrication difficulty of the mask and improving the fabrication accuracy of the mask. In a case where the size of the opening is constant, the area of the sub-pixels may be made substantially small, thereby increasing the resolution of the display panel. Because the sub-pixels in one unit are arranged along the second direction, the spacings between adjacent sub-pixels with different colors in the first direction and in the third direction may increase, thereby reducing the risk of color mixing of the sub-pixels. Because the arrangement direction of the two sub-pixels in one unit intersects with and is non-perpendicular to the direction of the pixel row, the jagged twill issue of the display panel may be solved to some extent.

Referring to FIG. 3, in certain embodiments, an angle between the second direction N and the first direction X may be in a range of approximately 30°-60°. The angle between the second direction N and the first direction X in the present disclosure may refer to an acute angle formed by the intersection of the two directions. If the angle exceeds the range of approximately 30°-60°, the arrangement of the two sub-pixels in the one unit may be close to an arrangement along the direction of the pixel row or the direction perpendicular to the direction of the pixel row, which may not facilitate resolving the jagged twill issue. Therefore, the angle between the second direction and the first direction may be in a range of approximately 30°-60°, which may facilitate to improve the jagged twill issue of the display panel.

Referring to FIG. 3, in certain embodiments, the shape of the first sub-pixel 1111 may include but not be limited to a rectangle, a diamond, a square, a hexagon, an octagon, a triangle, a circle, or an ellipse. The shape of the second sub-pixel 1211 may include but not be limited to a rectangle, a diamond, a square, a hexagon, an octagon, a triangle, a circle, or an ellipse. The shapes of the first and second sub-pixels may not be limited by the present disclosure, and may be selected according to an actual pixel arrangement structure design.

Referring to FIG. 3, in one embodiment, the color of the first sub-pixel 1111 may be blue or green, and the color of the second sub-pixel 1211 may be red. In another embodiment, the color of the first sub-pixel 1111 may be blue or red, and the color of the second sub-pixel 1211 may be green. In certain embodiments, the color of the first sub-pixel 1111 may be green or red, and the color of the second sub-pixel 1211 may be blue. The above designs each may enable full color display of the display panel. According to the display panel in the present disclosure, a quantity of the second sub-pixels may be greater than a quantity of the first sub-pixels with a same color. In an organic light-emitting display panel, the lifetime of blue sub-pixel may be the shortest. Therefore, using blue sub-pixels as the second sub-pixels may facilitate to improve the lifetime of the display panel. The display panel in the present disclosure may be an organic light-emitting display panel. For an organic light-emitting display panel, organic light-emitting devices may often be formed on a pixel definition layer to form the pixel arrangement structure. For illustrative purposes, the organic light-emitting display panel will be described in detail below.

Figure 4:
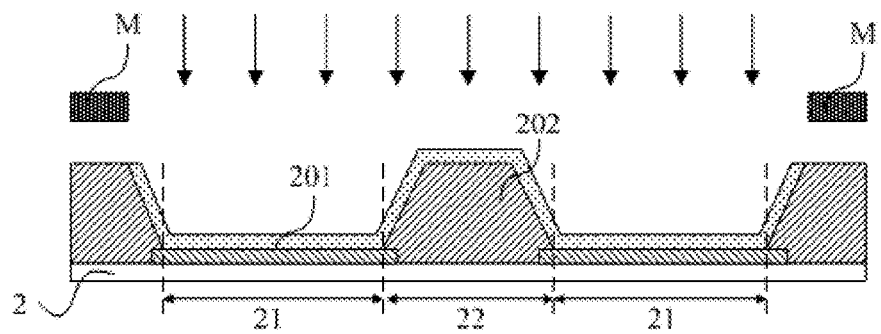
FIG. 4 illustrates a schematic A-A-sectional view of an exemplary display panel in FIG. 3 consistent with disclosed embodiments of the present disclosure.

FIG. 4 illustrates a schematic A-A-sectional view of the display panel in FIG. 3 consistent with disclosed embodiments of the present disclosure. Referring to FIGS. 3 and 4, the display panel may be an organic light-emitting display panel, and a schematic A-A-sectional view illustrates a schematic cross-sectional view of the second unit 121 along the second direction N. For illustrative purposes, a mask M is illustrated in FIG. 4. In the evaporation process of the organic light-emitting display panel, the two second sub-pixels 1211 in a same one second unit 121 may share one opening of the mask M for evaporation. The organic light-emitting display panel may include a pixel definition layer 2. The pixel definition layer 2 may include an opening region 21 and a protrusion 22 for defining the opening region 21. Because a pixel electrode 201 is disposed in the opening region 21 and is not disposed in the protrusion 22, even if light-emitting material 202 of the second sub-pixel 1211 is evaporated on the protrusion 22, the light-emitting material 202 at the protrusion 22 may not emit light, or the emitted light may be undetectable by the human eye due to substantially low carrier concentration, which may prevent light leakage. Similarly, the above principles may be applicable to the first unit 111.

In the organic light-emitting display panel, the two sub-pixels in one unit may share one mask opening, which may facilitate to increase the critical dimension of the mask, thereby reducing the fabrication difficulty of the mask. The reduction in fabrication difficulty of the mask may facilitate to obtain substantially high-precision mask and to reduce mask production cost. Meanwhile, in the organic light-emitting display panel using the pixel arrangement structure in the present disclosure, the two first sub-pixels in one first unit or the two second sub-pixels in one second unit may share one mask opening for evaporation. Therefore, the spacing between the two first sub-pixels in the one first unit may be reduced, and the spacing between the two second sub-pixels in the one second unit may be reduced, which may facilitate to increase the aperture ratio of the display panel, thereby improving the display performance of the display panel.

In an existing organic light-emitting display panel, adjacent sub-pixels with different colors share an electron transport layer and a hole injection layer. While driving a sub-pixel, carriers are also injected into an adjacent sub-pixel. If the spacing between adjacent two sub-pixels with different colors in a same one pixel row is small, adjacent sub-pixels may emit undesired light, which affects the display performance of the display panel. In the pixel arrangement structure in the present disclosure, because the sub-pixels in one unit are arranged along the second direction, the spacings between adjacent sub-pixels with different colors in the first direction and in the third direction may increase, which may effectively improve the undesired light issue of adjacent sub-pixels with different colors of the organic light-emitting display panel, and improve the display performance of the organic light-emitting display panel.

In the display panel in the present disclosure, one unit may include sub-pixels with a same one color. Therefore, when the display panel displays an image, each one sub-pixel may desire to form an equivalent pixel with sub-pixels with different colors in adjacent units. Each one second sub-pixel and two adjacent first sub-pixels with different colors may form one equivalent pixel. The equivalent pixel may have different forms of construction and will be described below.

Figure 5:
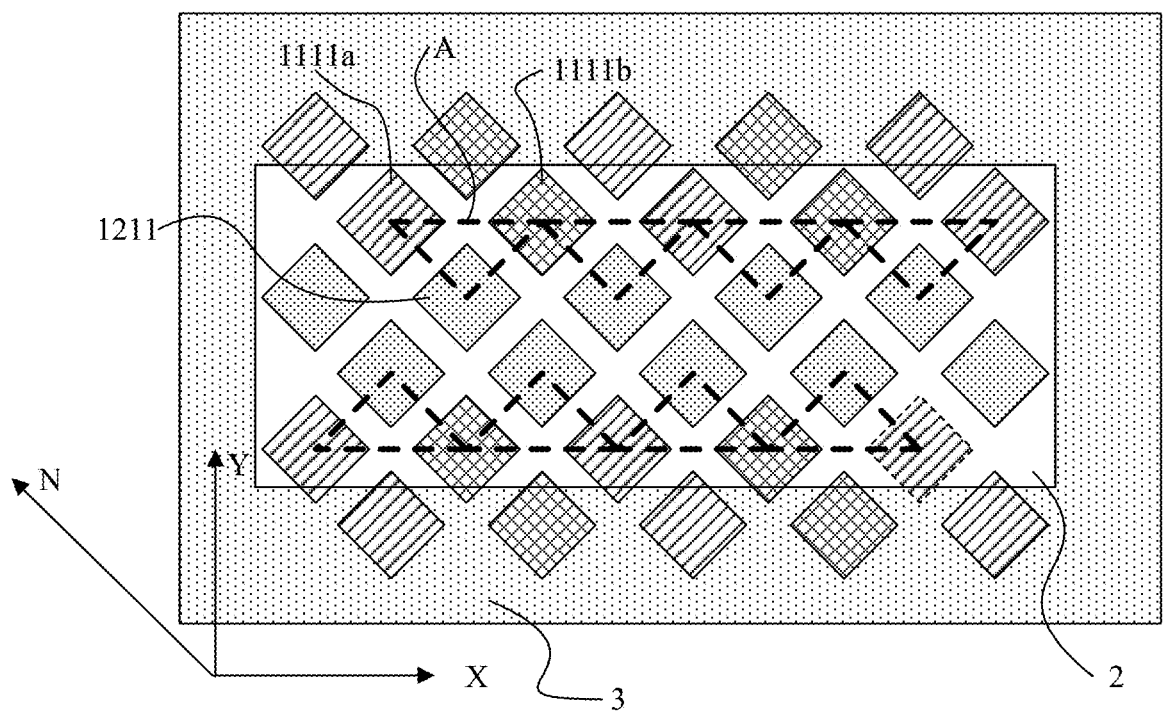
FIG. 5 illustrates a schematic structural diagram of an equivalent pixel consistent with disclosed embodiments of the present disclosure.

FIG. 5 illustrates a schematic structural diagram of an equivalent pixel consistent with disclosed embodiments of the present disclosure. Referring to FIG. 5, in one embodiment, one second sub-pixel 1211 and two adjacent first sub-pixels with different colors may form an equivalent pixel A. The two first sub-pixels with different colors may include a first sub-pixel 1111a with a first color and a first sub-pixel 1111b with a second color, respectively. The first sub-pixel 1111a with the first color and the first sub-pixel 1111b with the second color may be adjacent to each other in the first direction X. In view of this, one first sub-pixel may be shared by two adjacent equivalent pixels A in the first direction X, and the first sub-pixels or the second sub-pixels that are located at the most edge in the third direction Y cannot form an equivalent pixel. Therefore, the pixel electrodes may not be disposed in the first sub-pixels or the second sub-pixels that cannot form the equivalent pixel. In other words, a region where the first sub-pixels or the second sub-pixels that cannot form the equivalent pixel are located may refer to as a non-display region 3. The first sub-pixels and the second sub-pixels for display may be disposed in the display region 2, which may facilitate to ensure the narrow border design of the display panel.

Figure 6:
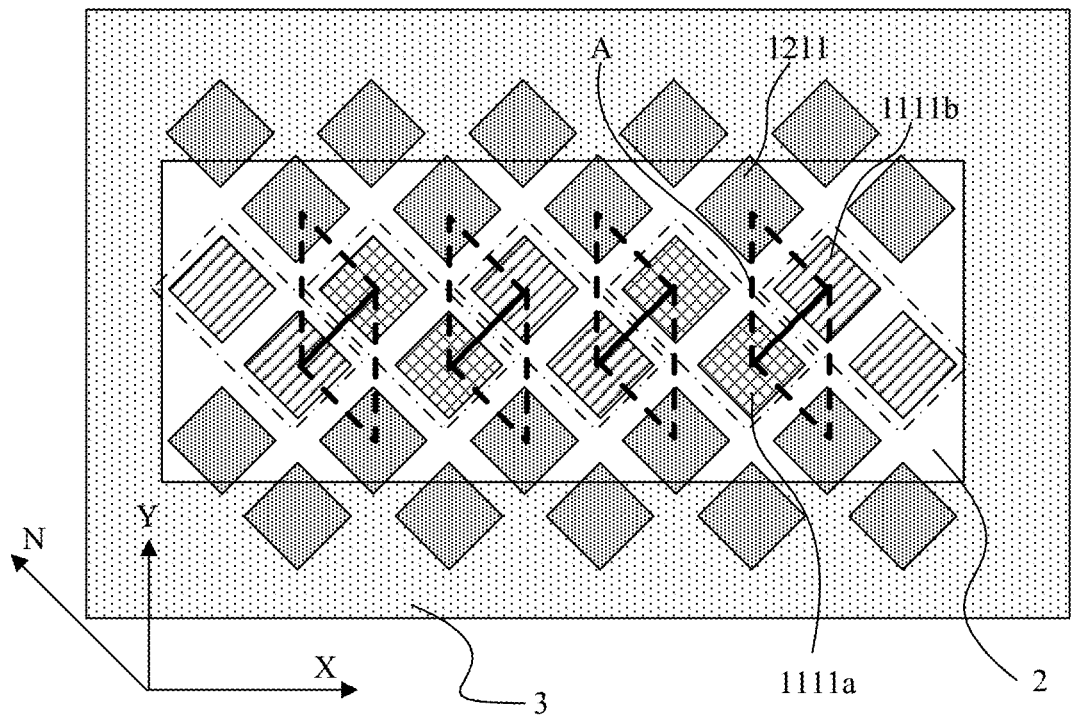
FIG. 6 illustrates a schematic structural diagram of another equivalent pixel consistent with disclosed embodiments of the present disclosure.

FIG. 6 illustrates a schematic structural diagram of another equivalent pixel consistent with disclosed embodiments of the present disclosure. Referring to FIG. 6, in one embodiment, one second sub-pixel 1211 and two adjacent first sub-pixels with different colors may form an equivalent pixel A. The two first sub-pixels with different colors may include a first sub-pixel 1111a with a first color and a first sub-pixel 1111b with a second color, respectively. The first sub-pixel 1111a with the first color and the first sub-pixel 1111b with the second color may belong to two adjacent first units 111, respectively. The second sub-pixel 1211 may be adjacent to the first sub-pixel 1111a with the first color in the third direction Y, and may be adjacent to the first sub-pixel 1111b with the second color in the second direction N. In view of this, one first sub-pixel may be shared by two adjacent equivalent pixels A in the third direction Y, and the first sub-pixels or the second sub-pixels that are located at the most edge in the third direction Y cannot form an equivalent pixel. Therefore, the pixel electrodes may not be disposed in the first sub-pixels or the second sub-pixels that cannot form the equivalent pixel. In other words, a region where the first sub-pixels or the second sub-pixels that cannot form the equivalent pixel are located may refer to as a non-display region 3. The first sub-pixels and the second sub-pixels for display may be disposed in the display region 2, which may facilitate to ensure the narrow border design of the display panel.

Figure 7:
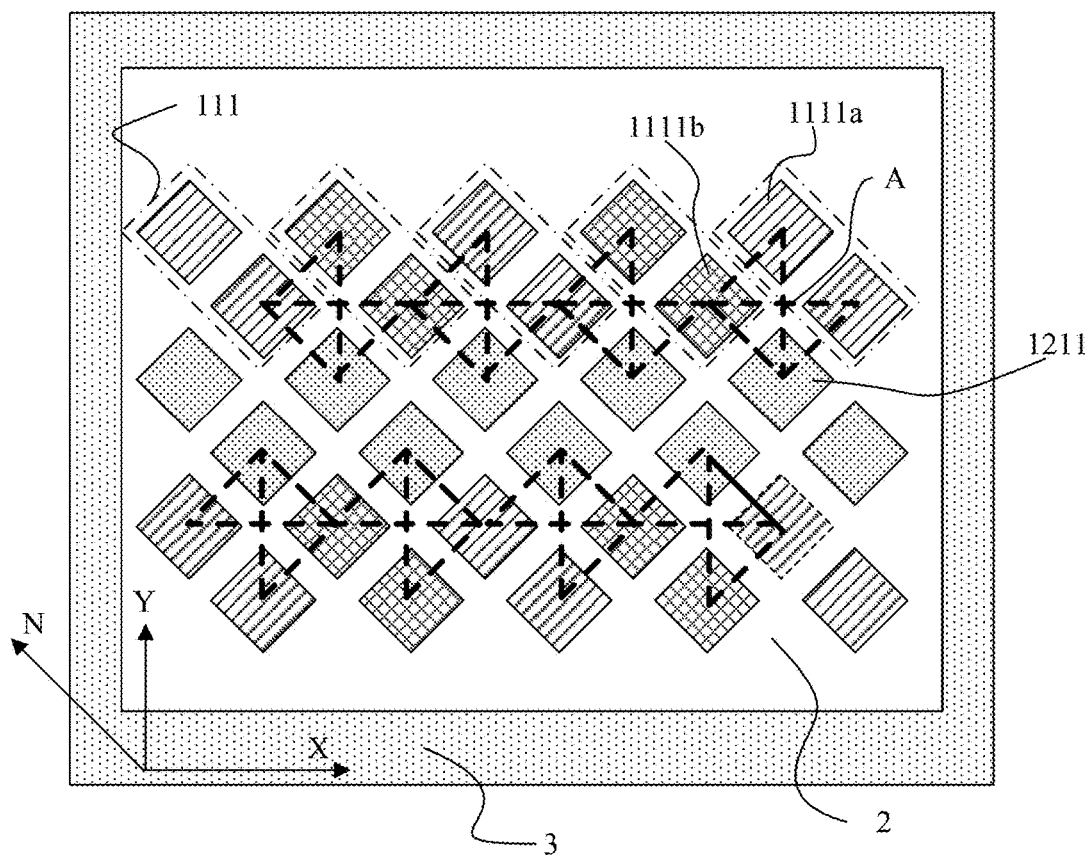
FIG. 7 illustrates a schematic structural diagram of another equivalent pixel consistent with disclosed embodiments of the present disclosure.

FIG. 7 illustrates a schematic structural diagram of another equivalent pixel consistent with disclosed embodiments of the present disclosure. Referring to FIG. 7, in one embodiment, one second sub-pixel 1211 and two adjacent first sub-pixels with different colors may form an equivalent pixel A. The two first sub-pixels with different colors may include a first sub-pixel 1111a with a first color and a first sub-pixel 1111b with a second color, respectively. In one embodiment, the first sub-pixel 1111a with the first color may be adjacent to the first sub-pixel 1111b with the second color in the third direction Y. In another embodiment, the first sub-pixel 1111a with the first color may be adjacent to the first sub-pixel 1111b with the second color in the first direction X. In view of this, one first sub-pixel may be shared by three adjacent equivalent pixels A.

Compared to the equivalent pixel configurations illustrated in FIGS. 5 and 6, in the equivalent pixel configuration illustrated in FIG. 7, when the pixel rows at both ends in the third direction Y are the first pixel rows, more first sub-pixels or second sub-pixels may be used for display, and all first sub-pixels and second sub-pixels may be disposed in the display region 2, thereby avoiding fabrication of unnecessary sub-pixels. In the equivalent pixel configuration illustrated in FIG. 7, when the pixel rows at both ends in the third direction Y are the first pixel rows, the first sub-pixels or the second sub-pixels that are located at the most edge in the first direction X cannot form an equivalent pixel. Therefore, the pixel electrodes may not be disposed in the first sub-pixels or the second sub-pixels that cannot form the equivalent pixel. In other words, a region where the first sub-pixels or the second sub-pixels that cannot form the equivalent pixel are located may refer to as a non-display region 3. The first sub-pixels and the second sub-pixels for display may be disposed in the display region 2, which may facilitate to ensure the narrow border design of the display panel.

The equivalent pixel configurations illustrated in FIGS. 5-7 each may display the image. Compared to the pixel arrangement structure illustrated in FIG. 2, the jagged twill issue may be effectively improved, and the display performance of the display panel may be improved.

Figure 8:
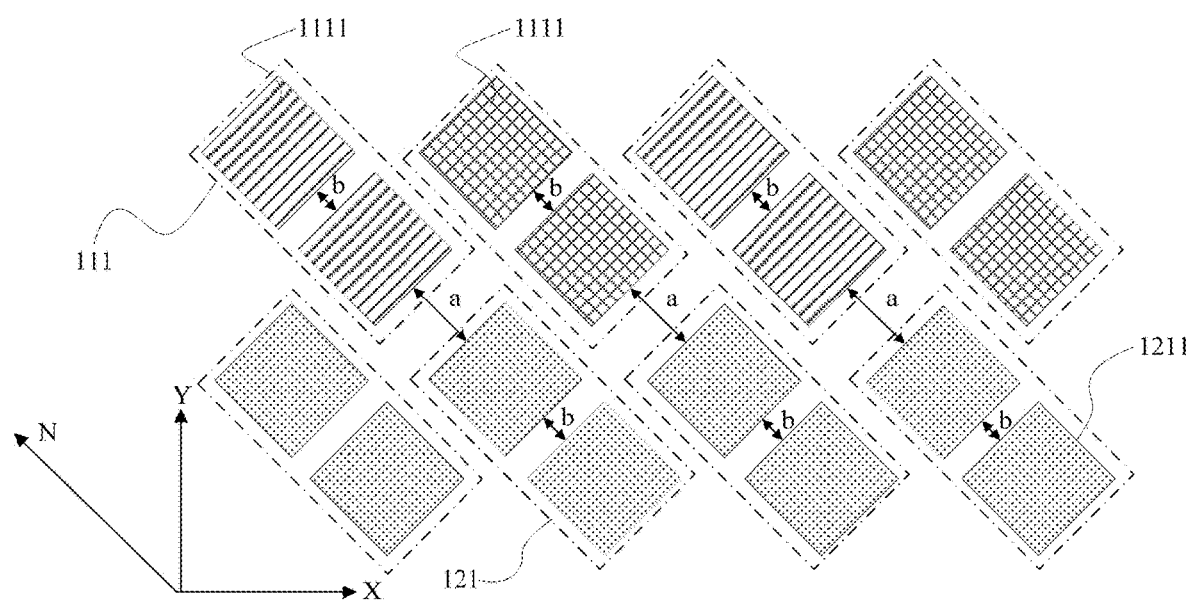
FIG. 8 illustrates a schematic top view of a pixel arrangement structure of an exemplary display panel consistent with disclosed embodiments of the present disclosure.

FIG. 8 illustrates a schematic top view of a pixel arrangement structure of an exemplary display panel consistent with disclosed embodiments of the present disclosure. Referring to FIG. 8, in the second direction N, a spacing between adjacent first sub-pixel 1111 and second sub-pixel 1211 is a, and a spacing between adjacent two first sub-pixels 1111 or between adjacent two sub-pixels 1211 is b, where a>b. The adjacent two first sub-pixels 1111 in the second direction N may refer to the two first sub-pixels 1111 in a same one first unit 111, and the adjacent two second sub-pixels 1211 in the second direction N may refer to the two second sub-pixels 1211 in a same one second unit 121. Compared to a=b, when a>b, in a case where the display panel has a same aperture ratio, the spacing between the adjacent first sub-pixel and second sub-pixel may become larger, which may reduce the probability of color mixing of adjacent sub-pixels with different colors, and reduce the evaporation difficulty of the display panel. For the organic light-emitting display panel, the increase of the spacing between the adjacent first sub-pixel and second sub-pixel may effectively improve the undesired light issue of the organic light-emitting display panel, and improve the display performance of the organic light-emitting display panel.

Referring to FIG. 8, in one embodiment, 21 µm≤a≤30 µm, and 10 µm≤b≤19 µm. In the prior art, for illustrative purposes, a rectangular opening is used as an example. The critical dimension of the mask, i.e., a length of a short side of the rectangular opening, is limited by the process, and is often greater than 20 µm. If the critical dimension is smaller than 20 µm, it is difficult to ensure the fabrication accuracy of the mask. In the pixel arrangement structure in the present disclosure, the two sub-pixels in one unit may share one mask opening, thereby increasing the critical dimension of the mask and ensuring the fabrication accuracy of the mask. The increase of the critical dimension of the mask may facilitate to improve the aperture ratio of the display panel, thereby ensuring the display performance of the display panel. The increase of the critical dimension of the mask may further facilitate to reduce the area of the sub-pixels, thereby improving the resolution of the display panel.

Figure 9:
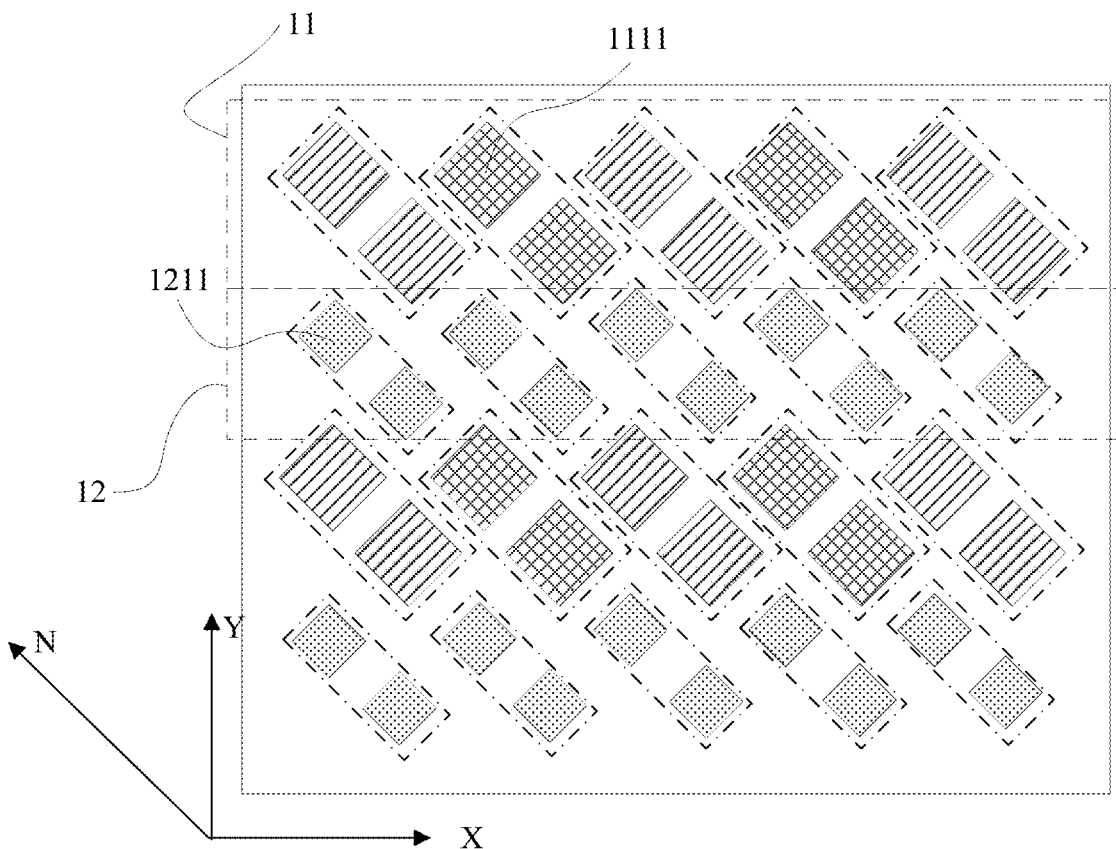
FIG. 9 illustrates a schematic top view of another exemplary display panel consistent with disclosed embodiments of the present disclosure.

FIG. 9 illustrates a schematic top view of another exemplary display panel consistent with disclosed embodiments of the present disclosure. Referring to FIG. 9, in the display panel, the area of the first sub-pixel 1111 may be larger than the area of the second sub-pixel 1211. In the display panel, the first pixel rows 11 and the second pixel rows 12 may be alternately arranged. Therefore, the quantity of the first pixel rows 11 and the quantity of the second pixel rows 12 may be equal or may have a difference of one. Therefore, a quantity of the first sub-pixels 1111 may be the same as or close to a quantity of the second sub-pixels 1211. However, because the first sub-pixels 1111 have two different colors, the quantity of the second sub-pixels 1211 may be or may be approximately twice a quantity of the first sub-pixels with a same one color. Moreover, because the first sub-pixel 1111 may be shared by adjacent equivalent pixels during the display process, the area of the first sub-pixels may be designed to be larger than the area of the second sub-pixels, which may facilitate to improve the display performance of the display panel.

Referring to FIG. 9, in certain embodiments, the first sub-pixel 1111 may have a shape different from the second sub-pixel 1211. For example, the first sub-pixel may have an octagonal shape, and the second sub-pixel may have a diamond shape. The first sub-pixel 1111 having a same shape as the second sub-pixel 1211 may increase an arrangement density of the display panel to a certain extent, thereby improving the aperture ratio of the display panel. Under the premise of ensuring the aperture ratio of the display panel and the accuracy of the mask, the shapes of the first and second sub-pixels are not limited by the present disclosure, and may be designed according to actual applications.

Figure 10:
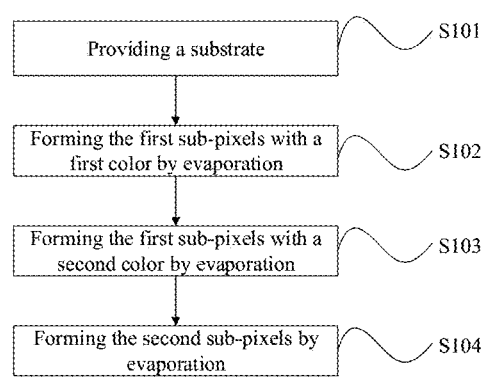
FIG. 10 illustrates a flow chart of an exemplary fabrication method of a display panel consistent with disclosed embodiments of the present disclosure.

The present disclosure also provides a fabrication method of a display panel for forming any one of the display panels in the disclosed embodiments. FIG. 10 illustrates a flow chart of an exemplary fabrication method of a display panel consistent with disclosed embodiments of the present disclosure. Referring to FIG. 10, the fabrication method of the display panel may include the following.

Figure 11:
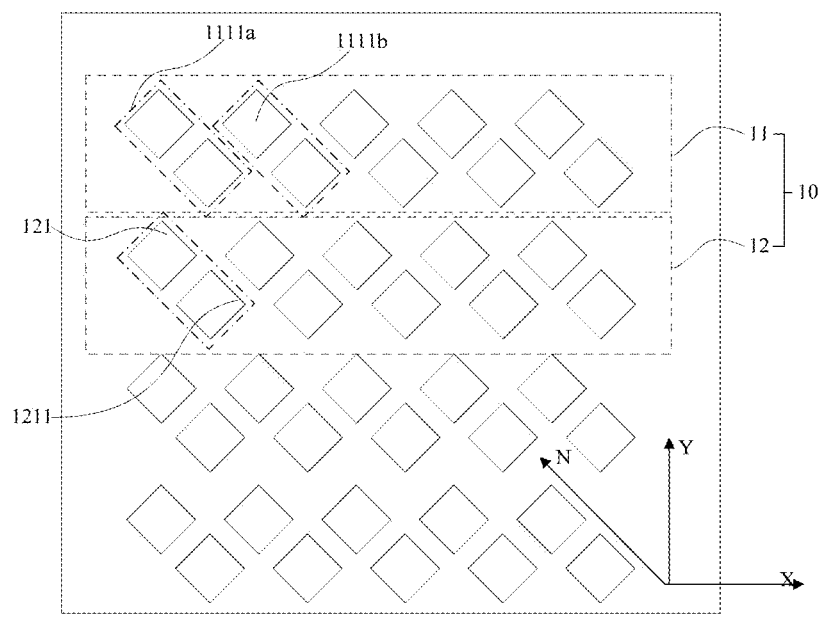
FIG. 11 illustrates a schematic top view of S101 in an exemplary fabrication method of a display panel consistent with disclosed embodiments of the present disclosure.

S101: Providing a substrate. FIG. 11 illustrates a schematic top view of S101 in the fabrication method of the display panel consistent with disclosed embodiments of the present disclosure. Referring to FIG. 11, a substrate may be provided. The substrate may include a plurality of pixel rows 10 extended along a first direction X. The plurality of pixel rows 10 may include alternately-arranged first pixel rows 11 and second pixel rows 12. A first pixel row 11 may include a plurality of first units 111, and a first unit 111 may include two first sub-pixels 1111 with a same color. The first sub-pixels 1111 in the first unit 111 may be arranged along a second direction N. The first sub-pixels 1111 in adjacent first units 111 may have different colors. The second direction N may intersect with but may not be perpendicular to the first direction X. A second pixel row 12 may include a plurality of second units 121, and a second unit 121 may include two second sub-pixels 1211 with a same color. The second sub-pixels 1211 in the second unit 121 may be arranged along the second direction N. The first pixel rows 11 and the second pixel rows 12 may be alternately arranged along a third direction Y perpendicular to the first direction X. The first sub-pixel 1111 may have a color different from the second sub-pixel 1211.

Figure 12:
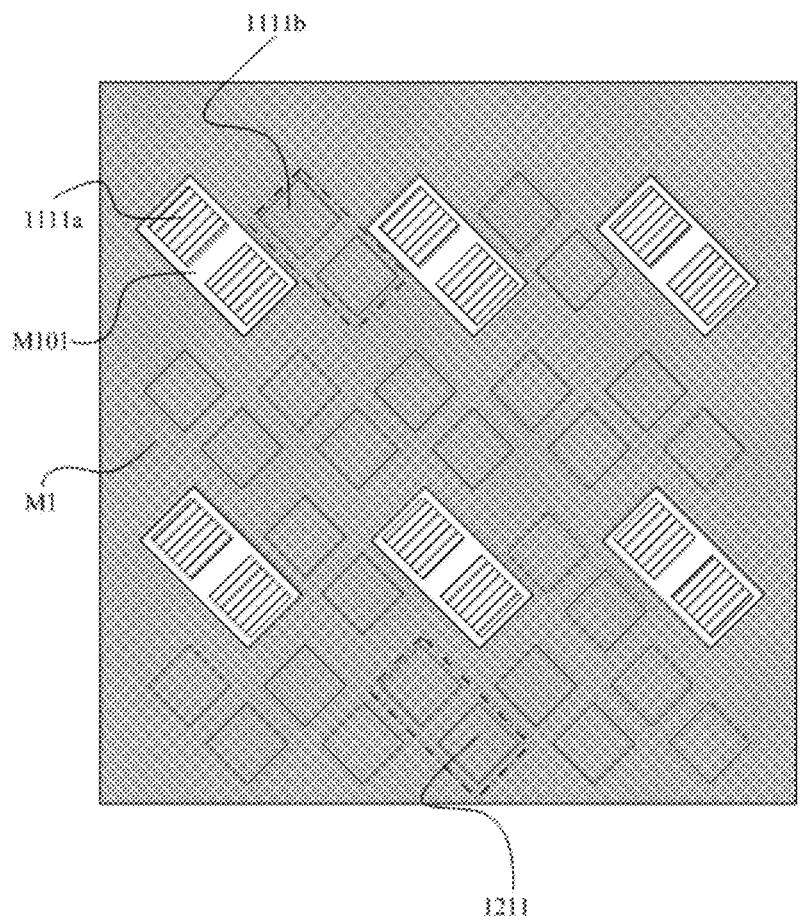
FIG. 12 illustrates a schematic top view of S102 in an exemplary fabrication method of a display panel consistent with disclosed embodiments of the present disclosure.

S102: Forming the first sub-pixels with a first color by evaporation. FIG. 12 illustrates a schematic top view of S102 in the fabrication method of the display panel consistent with disclosed embodiments of the present disclosure. Referring to FIG. 12, a first mask M1 may include a plurality of first openings M101, and two first sub-pixels 1111a with the first color in a same one first unit may share one first opening M101. The first sub-pixels 1111a with the first color may be fabricated by evaporation using the first mask.

Figure 13:
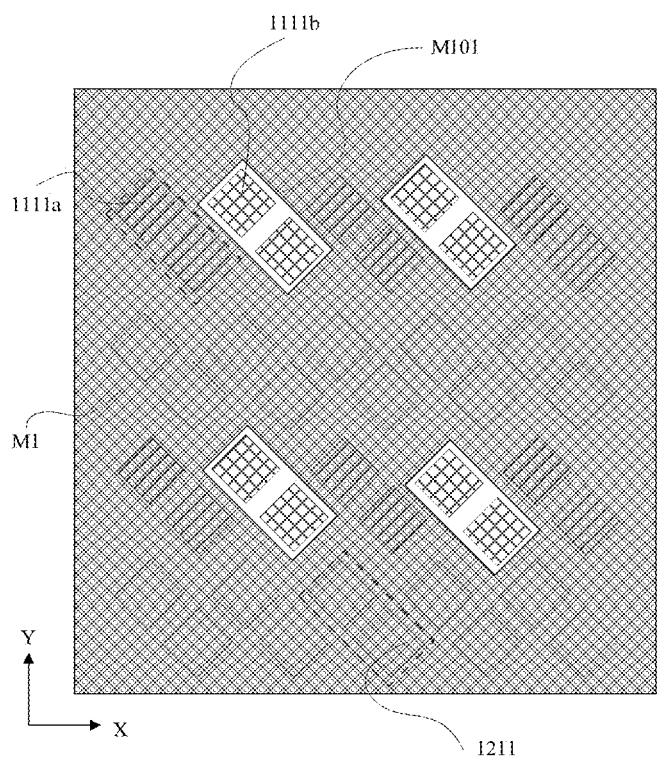
FIG. 13 illustrates a schematic top view of S103 in an exemplary fabrication method of a display panel consistent with disclosed embodiments of the present disclosure.

S103: Forming the first sub-pixels with a second color by evaporation. FIG. 13 illustrates a schematic top view of S103 in the fabrication method of the display panel consistent with disclosed embodiments of the present disclosure. Referring to FIG. 13, two first sub-pixels 1111b with the second color may be fabricated by evaporation using the first mask M1, where the two first sub-pixels 1111b with the second color in a same one first unit may share one first opening M101.

Referring to FIGS. 11 and 13, the first sub-pixels 1111 in adjacent first units 111 may have different colors. In other words, the first units having the first sub-pixels 1111a with the first color and the first units having the first sub-pixels 1111b with the second color may be alternately arranged in the first direction X, and the first pixel rows 11 and the second pixel rows 12 may be alternately arranged in the third direction Y. Therefore, in the first direction X, the spacing between adjacent two first units 111 having the first sub-pixels 1111b with the second color may be equal to the spacing between adjacent two first units 111 having the first sub-pixels 1111a with the first color. Similarly, in the third direction Y, the spacing between the nearest two adjacent first units 111 having the first sub-pixels 1111b with the second color may be equal to the spacing between the nearest two adjacent first units 111 having the first sub-pixels 1111a with the first color. Therefore, the first mask M1 may also be used to fabricate the first sub-pixels 1111b with the second color by evaporation. Before forming the first sub-pixels 1111b with the second color and after forming the first sub-pixels 1111a with the first color by evaporation, the first mask M1 may be translated in the first direction X to cover the first sub-pixels 1111a with the first color and to expose the first sub-pixels 1111b with the second color at the first opening M101. Accordingly, the first sub-pixels with the second color may be fabricated by evaporation using the first mask M1.

Figure 14:
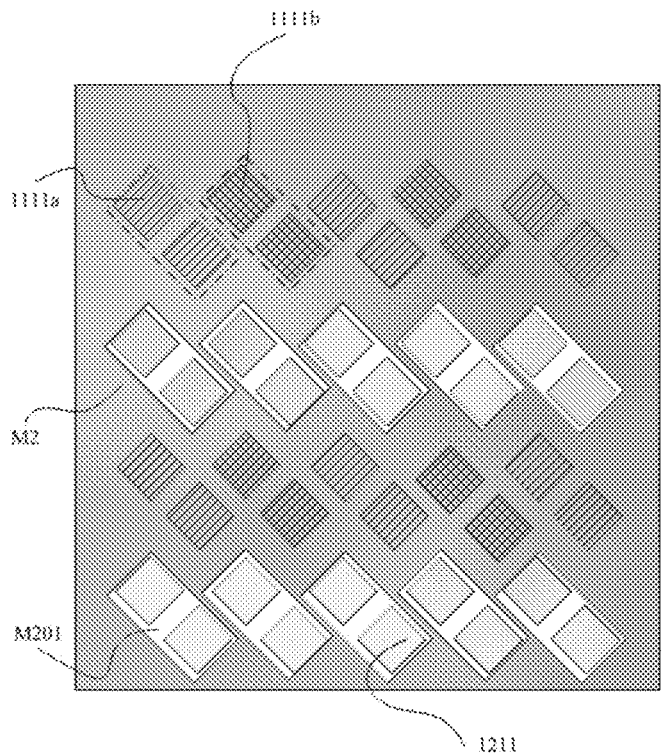
FIG. 14 illustrates a schematic top view of S104 in an exemplary fabrication method of a display panel consistent with disclosed embodiments of the present disclosure.

S104: Forming the second sub-pixels by evaporation. FIG. 14 illustrates a schematic top view of S104 in the fabrication method of the display panel consistent with disclosed embodiments of the present disclosure. Referring to FIG. 14, a second mask M2 may include a plurality of second openings M201, and two second sub-pixels 1211 in a same one second unit may share one second opening M201. The second sub-pixels 1211 may be fabricated by evaporation using the second mask M2.

In the fabrication method of the display panel in the present disclosure, two sub-pixels (the sub-pixel may refer to the first sub-pixel or the second sub-pixel) with a same color may form one unit, and the two sub-pixels in the one unit may be fabricated by evaporation at the same time. In other words, the two sub-pixels in the one unit may share one mask opening. In a case where the area of sub-pixels is constant, the size of the mask opening may increase, thereby reducing the fabrication difficulty of the mask and improving the fabrication accuracy of the mask. In a case where the size of the opening is constant, the area of the sub-pixels may be made substantially small, thereby increasing the resolution of the display panel. Because the sub-pixels in one unit are arranged along the second direction, the spacings between adjacent sub-pixels with different colors in the first direction and in the third direction may increase, thereby reducing the risk of color mixing of the sub-pixels. Because the arrangement direction of the two sub-pixels in one unit intersects with and is non-perpendicular to the direction of the pixel row, the jagged twill issue of the display panel may be solved to some extent.

Figure 15:
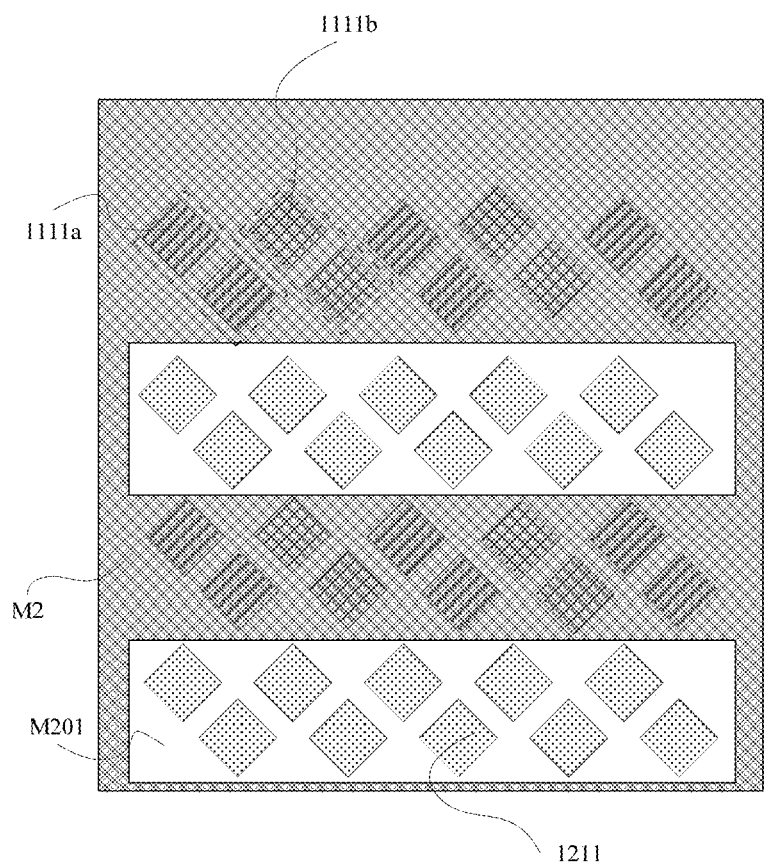
FIG. 15 illustrates a schematic top view of S104 in another exemplary fabrication method of a display panel consistent with disclosed embodiments of the present disclosure.

FIG. 15 illustrates a schematic top view of S104 in another fabrication method of the display panel consistent with disclosed embodiments of the present disclosure. Referring to FIG. 15, the second mask M2 may include a plurality of second openings M201, and all the second sub-pixels 1211 in a same one second pixel row may share one second opening M201. The second sub-pixels 1211 may be fabricated by evaporation using the second mask M2.

Because the second pixel row merely includes the second units, all the second sub-pixels 1211 in the same one second pixel row may share one second opening M201. Therefore, the fabrication difficulty of the second mask may be further reduced, the fabrication accuracy of the mask may be improved, which may facilitate to reduce the fabrication difficulty of the second sub-pixels by evaporation.

In the present disclosure, different masks may be used to fabricate the first sub-pixels with the first color and the first sub-pixels with the second color by evaporation, which is not limited by the present disclosure.

The detailed structures of the first and second masks may be designed according to the specific pixel arrangement structure of the display panel. The specific pixel arrangement structure of the display panel may refer to the corresponding descriptions in the above disclosed embodiments, and is not repeated herein.

Accordingly, in the display panel in the present disclosure, two sub-pixels (the first sub-pixel and the second sub-pixel) with a same color may form one unit, and the two sub-pixels in the one unit may be fabricated by evaporation at the same time. In other words, the two sub-pixels in the one unit may share one mask opening. In a case where the area of sub-pixels is constant, the size of the mask opening may increase, thereby reducing the fabrication difficulty of the mask and improving the fabrication accuracy of the mask. In a case where the size of the opening is constant, the area of the sub-pixels may be made substantially small, thereby increasing the resolution of the display panel. Because the sub-pixels in one unit are arranged along the second direction, the spacings between adjacent sub-pixels with different colors in the first direction and in the third direction may increase, thereby reducing the risk of color mixing of the sub-pixels. Because the arrangement direction of the two sub-pixels in one unit intersects with and is non-perpendicular to the direction of the pixel row, the jagged twill issue of the display panel may be solved to some extent.

In the fabrication method of the display panel in the present disclosure, two sub-pixels (the first sub-pixel and the second sub-pixel) with a same color may form one unit, and the two sub-pixels in the one unit may be fabricated by evaporation at the same time. In other words, the two sub-pixels in the one unit may share one mask opening. In a case where the area of sub-pixels is constant, the size of the mask opening may increase, thereby reducing the fabrication difficulty of the mask and improving the fabrication accuracy of the mask. In a case where the size of the opening is constant, the area of the sub-pixels may be made substantially small, thereby increasing the resolution of the display panel. Because the sub-pixels in one unit are arranged along the second direction, the spacings between adjacent sub-pixels with different colors in the first direction and in the third direction may increase, thereby reducing the risk of color mixing of the sub-pixels. Because the arrangement direction of the two sub-pixels in one unit intersects with and is non-perpendicular to the direction of the pixel row, the jagged twill issue of the display panel may be solved to some extent. Further, the first units with different colors may be fabricated by evaporation using a same one mask, which may facilitate to reduce a quantity of the masks, thereby reducing the production cost.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments illustrated herein but is to be accorded the widest scope consistent with the principles and novel features disclosed herein.

What is claimed is:

1. A display panel, comprising:
a plurality of pixel rows extended along a first direction, wherein the plurality of pixel rows includes first pixel rows and second pixel rows that are alternately arranged, wherein:
a first pixel row includes a plurality of first units, each of the plurality of first units includes two first sub-pixels with a same color, the two first sub-pixels in each of the plurality of first units are arranged along a second direction, first sub-pixels in adjacent first units have different colors, and the second direction intersects with and is non-perpendicular to the first direction,
a second pixel row includes a plurality of second units, each of the plurality of second units includes two second sub-pixels with a same color, the two second sub-pixels in each of the plurality of second units are arranged along the second direction, and in the second direction, a distance between each two adjacent sub-pixels with different colors is greater than a distance between each two adjacent sub-pixels with a same color,
a number of the first units in the first pixel row equals a number of the second units in the second pixel row,
the first pixel rows and the second pixel rows are alternately arranged in a third direction perpendicular to the first direction, and
each of the two first sub-pixels has a color different from the second sub-pixels.

2. The display panel according to claim 1, wherein:
each second sub-pixel and two adjacent first sub-pixels with different colors form an equivalent pixel.

3. The display panel according to claim 2, wherein:
in a same one equivalent pixel, the two adjacent first sub-pixels with different colors include a first of the two adjacent first sub-pixels with a first color and a second of the two adjacent first sub-pixels with a second color, respectively, and
the first sub-pixel with the first color is adjacent to the first sub-pixel with the second color in the first direction.

4. The display panel according to claim 2, wherein:
in a same one equivalent pixel, the two adjacent first sub-pixels with different colors include a first of the two adjacent first sub-pixels with a first color and a second of the two adjacent first sub-pixels with a second color, respectively, and
the second sub-pixel is adjacent to the first of the two adjacent first sub-pixels with the first color in the third direction, and is adjacent to the second of the two adjacent first sub-pixels with the second color in the second direction.

5. The display panel according to claim 1, wherein:
in the second direction, a spacing between adjacent first sub-pixel and second sub-pixel is a, and a spacing between adjacent two first sub-pixels or between adjacent two second sub-pixels is b, wherein a>b.

6. The display panel according to claim 5, wherein:
21 μm≤a≤30 μm, and
10 μm≤b≤19 μm.

7. The display panel according to claim 1, wherein:
the first sub-pixel has an area larger than the second sub-pixel.

8. The display panel according to claim 7, wherein:
the first sub-pixel has a same shape as the second sub-pixel.

9. The display panel according to claim 1, wherein:
a first color of each of the first sub-pixels is blue or green, and a second color of each of the second sub-pixels is red; or
the first color of each of the first sub-pixels is blue or red, and the second color of each of the second sub-pixels is green; or
the first color of each of the first sub-pixels is green or red, and the second color of each of the second sub-pixels is blue.

10. The display panel according to claim 1, wherein:
a shape of the first sub-pixel includes one of a rectangle, a diamond, a square, a hexagon, an octagon, a triangle, a circle, and an ellipse; and
a shape of the second sub-pixel includes one of a rectangle, a diamond, a square, a hexagon, an octagon, a triangle, a circle, and an ellipse.

11. The display panel according to claim 1, wherein:
an angle between the second direction and the first direction is in a range of approximately 30°-60°.

12. The display panel according to claim 1, wherein:
the display panel is an organic light-emitting display panel.

13. The display panel according to claim 1, wherein:
the first units and the second units are alternately arranged in the second direction.

* * * * *